United States Patent
Chen et al.

(10) Patent No.: US 10,542,297 B2
(45) Date of Patent: Jan. 21, 2020

(54) METHODS AND APPARATUS FOR SIGNALING ASSET CHANGE INFORMATION FOR MEDIA CONTENT

(71) Applicant: MediaTek Inc., Hsin-Chu (TW)

(72) Inventors: Lulin Chen, San Jose, CA (US); Shan Liu, San Jose, CA (US)

(73) Assignee: MediaTek Inc., Hsin-Chu (TW)

( * ) Notice: Subject to any disclaimer, the term of this patent is extended or adjusted under 35 U.S.C. 154(b) by 0 days.

(21) Appl. No.: 15/912,413

(22) Filed: Mar. 5, 2018

(65) Prior Publication Data

US 2018/0262784 A1     Sep. 13, 2018

Related U.S. Application Data (60) Provisional application No. 62/533,716, filed on Jul. 18, 2017, provisional application No. 62/528,620, (Continued)

(51) Int. Cl.
*H04N 21/00* (2011.01)
*H04N 21/234* (2011.01)
(Continued)

(52) U.S. Cl.
CPC ........ *H04N 21/234* (2013.01); *H03M 13/611* (2013.01); *H04L 65/1003* (2013.01); *H04L 65/4084* (2013.01); *H04N 21/236* (2013.01)

(58) Field of Classification Search
CPC .............. H04N 21/234; H04N 21/236; H04N 21/2383; H04N 21/23424; H03M 13/611;
(Continued)

(56) References Cited

U.S. PATENT DOCUMENTS

2012/0137015 A1    5/2012  Sun
2014/0314158 A1*  10/2014  Hwang ................ H04L 1/0041
                                                    375/240.27
(Continued)

FOREIGN PATENT DOCUMENTS

WO    WO 2018/165215 A1    9/2018

OTHER PUBLICATIONS

International Search Report and Written Opinion dated May 15, 2018 in connection with International Application No. PCT/US2018/021229.

(Continued)

*Primary Examiner* — Zhihan Zhou
(74) *Attorney, Agent, or Firm* — Wolf, Greenfield & Sacks, P.C.

(57) ABSTRACT

The techniques described herein relate to methods, apparatus, and computer readable media configured to perform an asset change for video data. First video data comprises a sequence of data units separated by data unit boundaries, and a sequence of error correction data units, wherein each error correction data unit is associated with one or more data units from the sequence of data units. Based on the received first video data, it can be determined whether an error correction data unit from the sequence of error correction data units associated with an asset change point of the first video data crosses one or more data unit boundaries of the first video data. Based on the determination, an asset change operation for the first video data and second video data is performed, wherein the second video data is different than the first video data.

19 Claims, 7 Drawing Sheets

Related U.S. Application Data filed on Jul. 5, 2017, provisional application No. 62/467,861, filed on Mar. 7, 2017.

(51) Int. Cl.
*H03M 13/00* (2006.01)
*H04L 29/06* (2006.01)
*H04N 21/236* (2011.01)

(58) Field of Classification Search
CPC . H04L 65/4084; H04L 65/605; H04L 65/607; H04L 65/1003
See application file for complete search history.

(56) References Cited

U.S. PATENT DOCUMENTS

2014/0344852 A1* 11/2014 Reisner .............. H04N 21/2668
725/32
2015/0296231 A1   10/2015 Kwon et al.

OTHER PUBLICATIONS

No Author Listed, ISO/IEC 23008-1:2018 FDAM 2 Enhancements for Mobile Environments, International Organization for Standardization, ISO/IEC JTC1/SC29/WG11, Coding of Moving Pictures and Audio, MPEG/w17196, Oct. 2017, Macau, China, 75 pages.

* cited by examiner

| Syntax | Value | No. of bits | Mnemonic |
|---|---|---|---|
| ACR_message () { | | | |
|   message_id | | 16 | uimsbf |
|   version | | 8 | uimsbf |
|   length | | 16 | uimsbf |
|   message_payload{ | | | |
|     target_MMT_package_id_length | N1 | 8 | uimsbf |
|     for (i=0; i<N1; i++) { | | | |
|       target_MMT_package_id | | | |
|     } | | | |
|   MMT_package_id_byte | | 8 | uimsbf |
|   number_of_assets | N2 | 8 | uimsbf |
|   for (i=0; i<N2; i++) { | | | |
|     target_asset_id() | | | |
|     target_asset_type | | | |
|     duration | | 32 | char |
|     change_type | | 32 | uimsbf |
|     change_indicate_mode | | 8 | uimsbf |
|     if (change_indicate_mode == 0x01) { | | 8 | uimsbf |
|       UTC_timestamp | | 32 | uimsbf |
|     } | | | |
|     else if (change_indicate_mode == 0x02) { | | | |
|       mpu_sequence_number | | 32 | uimsbf |
|     } | | | |
|     else if (change_indicate_mode == 0x03) { | | | |
|       mpu_timestamp_descriptor() | | | |
|     } | | | |
|     designated_MMT_general_location_info() | | | |
|     FEC_Clean_Flag | | | |
|     reserved | '111 111' | 1 | bslbf |
|     private_extension_flag | | 6 | |
|     if (private_extension_flag == 1) { | | 1 | bslbf |
|       private_extension | | | |
|     } | | | |
|   } | | | |
| } | | | |

| Type | Description |
|---|---|
| 0x00 | Reserved |
| 0x01 | Replace the target Asset with designated Asset. |
| 0x02 | Overlay designated Asset on the target Asset. |
| 0x03~0xFF | Reserved |

| Type | Description |
|---|---|
| 0x00 | Reserved |
| 0x01 | Replace the target Asset with designated Asset. |
| 0x02 | Overlay designated Asset on the target Asset. |
| 0x03 | Insert before the target Asset with designated Asset |
| 0x04~0xFF | Reserved |

FIG. 6

| Value | Compositing mode | Description |
|---|---|---|
| 1 | Clear | No regions are enabled. |
| 2 | Source | Only the source will be present. |
| 3 | Destination | Only the destination will be present. |
| 4 | Source Over | Source is placed over the destination. |
| 5 | Destination Over | Destination is placed over the source. |
| 6 | Source In | Source that overlaps the destination, replaces the destination. |
| 7 | Destination In | Destination which overlaps the source, replaces the source. |
| 8 | Source Out | Source is placed, where it falls outside of the destination. |
| 9 | Destination Out | Destination is placed, where it falls outside of the source. |
| 10 | Source Atop | Source which overlaps the destination, replaces the destination. Destination is placed elsewhere. |
| 11 | Destination Atop | Destination which overlaps the source replaces the source. Source is placed elsewhere. |
| 12 | XOR | The non-overlapping regions of source and destination are combined. |
| 13~16 | Reserved | |
| 17 | Dissolve | Takes random pixels from both layers. With high opacity, most pixels are taken from the source layer. With low opacity most pixels are taken from the destination layer. |
| 18 | Plus | Display the sum of the source image and destination image. |
| 19 | Multiply | The source color is multiplied by the destination color and replaces the destination. |
| 20 | Screen | The values of the pixels in the two layers are inverted, multiplied, and then inverted again |
| 21 | Overlay | Overlay combines Multiply and Screen blend modes. |
| 22 | Darken | Selects the darker of the destination and source colors. |
| 23 | Lighten | Selects the lighter of the destination and source colors |
| 24 | Color_dodge | Brightens the destination color to reflect the source color |
| 25 | Color_burn | Darkens the destination color to reflect the source color |
| 26 | Hard_light | Multiplies or screens the colors, depending on the source color value. |
| 27 | Soft_light | Darkens or lightens the colors, depending on the source color value. |
| 28 | Difference | Subtracts the darker of the two constituent colors from the lighter color |
| 29 | Exclusion | Produces an effect similar to that of the Difference mode but lower in contrast. |
| 30~255 | Reserved | For new modes or non-separable blending modes. |

METHODS AND APPARATUS FOR SIGNALING ASSET CHANGE INFORMATION FOR MEDIA CONTENT

RELATED APPLICATIONS

This Application claims priority under 35 U.S.C. § 119(e) to U.S. Provisional Application Ser. No. 62/467,861, titled "METHOD AND APPARATUS OF SIGNALING DATA UNIT BOUNDARY AWARE FEC FOR MPEG MMT," filed Mar. 7, 2017, U.S. Provisional Application Ser. No. 62/528,620, titled "METHOD AND APPARATUS OF SIGNALING ASSET CHANGE TYPE IN MMT," filed Jul. 5, 2017, and U.S. Provisional Application Ser. No. 62/533,716, titled "METHOD OF SIGNALING FEC BLOCK SIZE AWARENESS WITH MMT MESSAGES," filed Jul. 18, 2017, which are herein incorporated by reference in their entirety.

TECHNICAL FIELD

The techniques described herein relate generally to the transport and delivery of coded media data, including signaling whether error correction takes into account the structure of the underlying data content, and signaling asset change data.

BACKGROUND OF INVENTION

MPEG-H is a group of standards being developed by the ISO/IED Motion Picture Experts Group (MPEG), and is often referred to as ISO/IEC 23008. MPEG-H includes a number of different parts. MPEG-H standards include a digital format/container standard, a video compression standard, and an audio compression standard. Part 1 (MPEG-H Part 1 (ISO/IEC 23008-1)) is MPEG media transport (MMT). MMT is a media streaming format for the transport and delivery of coded media data for multimedia services over heterogeneous packet-switched networks. MMT deployments can include, for example, traditional broadcast TV service and internet streaming. To support desired business models for such services, splicing features such advertisement (Ad) insertion (e.g., pre-roll and mid-roll ad insertion, program editing, and program switching), are desired to support integration of the services.

Error correction, such as application layer forward error correction (AL-FEC), can be used in conjunction with MMT. However, some approaches add the FEC as a layer on top of the MMT packages. Therefore, performing splicing features often requires processing the FEC layer prior to being able to process the MMT packages. Additionally, existing techniques may not provide and/or support sufficient splicing capabilities needed by encoding devices to support these services. For example, encoding devices may need to perform compression encoding, FEC encoding, and MMTP packetizing.

SUMMARY OF INVENTION

In accordance with the disclosed subject matter, apparatus, systems, and methods are provided for encoding and/or splicing data based on the FEC encoding.

Some embodiments relate to a method for performing an asset change for video data. The method includes receiving first video data, wherein the first video data comprises a sequence of data units separated by data unit boundaries, and a sequence of error correction data units, wherein each error correction data unit is associated with one or more data units from the sequence of data units. The method includes determining, based on the received first video data, whether an error correction data unit from the sequence of error correction data units associated with an asset change point of the first video data crosses one or more data unit boundaries of the first video data. The method includes performing, based on the determination, an asset change operation for the first video data and second video data, wherein the second video data is different than the first video data.

In some examples, determining whether the error correction unit crosses one or more data unit boundaries includes receiving an asset change request message that comprises data indicative of whether the error correction unit crosses one or more data unit boundaries, and determining whether the error correction unit crosses one or more data unit boundaries based on the received data.

In some examples, the method includes determining, based on the received data, that the error correction unit crosses one or more data unit boundaries, and performing the asset change includes performing error correction processing on the sequence of error correction data units, and performing the asset change.

In some examples, the method includes determining, based on the received data, that none of the sequence of error correction units cross any data unit boundaries, and performing the asset change includes performing the asset change at a level of the sequence of error correction data units, such that error correction processing does not need to be performed on the sequence of error correction data units to perform the asset change.

In some examples, the second video data includes a second sequence of data units separated by second data unit boundaries, and a second sequence of error correction data units, wherein each error correction data unit is associated with one or more data units from the second sequence of data units, and the method further includes determining, based on the received data, that none of the sequence of error correction units cross any data unit boundaries, and none of the second sequence of error correction units cross any second data unit boundaries, and performing the asset change comprises performing the asset change at a level of the sequence of error correction data units and second error correction data units, such that error correction processing does not need to be performed on the sequence of error correction data units or the second sequence of error correction data units to perform the asset change.

In some examples, the asset change request further comprises second data indicative of an asset change type, wherein the asset change type comprises an insertion type indicating the second video data is to be inserted before the first video data.

Some embodiments relate to a method for encoding asset change information for video data. The method includes encoding first video data, wherein the first video data comprises a sequence of data units separated by data unit boundaries, and a sequence of error correction data units, wherein each error correction data unit is associated with one or more data units from the sequence of data units. The method includes generating error correction encoding data, based on the encoding step, to indicate whether an error correction data unit from the sequence of error correction data units associated with an asset change point of the first video data crosses one or more data unit boundaries of the first video data. The method includes transmitting the encoded first video data and the generated error correction encoding data, such that a receiving device can perform, based on the generated error correction encoding data, an asset change operation for the first video data and second video data, wherein the second video data is different than the first video data.

In some examples, generating the error correction encoding data includes generating an asset change request message that comprises data indicative of whether the error correction unit crosses one or more data unit boundaries, and transmitting the encoded first video data and the generated data comprises transmitting the encoded first video data and the asset change request message.

In some examples, generating the asset change request message includes generating data indicative of the error correction unit crossing one or more data unit boundaries, such that the receiving device will perform error correction processing on the sequence of error correction data units to perform the asset change operation.

In some examples, generating the asset change request message includes generating data indicative of none of the sequence of error correction units cross any data unit boundaries, such that the receiving device will perform the asset change operation at a level of the sequence of error correction data units, such that error correction processing does not need to be performed on the sequence of error correction data units to perform the asset change operation.

In some examples, generating the asset change request message comprises generating data indicative of none of the sequence of error correction units cross any data unit boundaries, and none of a second sequence of error correction units of second video data cross any second data unit boundaries of the second video data, wherein each error correction data unit is associated with one or more data units from a second sequence of data units separated by the second data unit boundaries, such that the receiving device will perform the asset change operation at a level of the sequence of error correction data units and second error correction data units, such that the receiving device does not perform error correction processing on the sequence of error correction data units or the second sequence of error correction data units to perform the asset change operation.

In some examples, generating the asset change request message includes generating second data indicative of an asset change type, wherein the asset change type comprises an insertion type indicating the second video data is to be inserted before the first video data.

Some embodiments relate to an apparatus for performing an asset change for video data, the apparatus comprising a processor in communication with memory, the processor being configured to execute instructions stored in the memory that cause the processor to receive first video data, wherein the first video data includes a sequence of data units separated by data unit boundaries, and a sequence of error correction data units, wherein each error correction data unit is associated with one or more data units from the sequence of data units. The instructions cause the processor to determine, based on the received first video data, whether an error correction data unit from the sequence of error correction data units associated with an asset change point of the first video data crosses one or more data unit boundaries of the first video data. The instructions cause the processor to perform, based on the determination, an asset change operation for the first video data and second video data, wherein the second video data is different than the first video data.

In some examples, determining whether the error correction unit crosses one or more data unit boundaries includes receiving an asset change request message that comprises data indicative of whether the error correction unit crosses one or more data unit boundaries, and determining whether the error correction unit crosses one or more data unit boundaries based on the received data.

In some examples, the processor is configured to execute instructions stored in the memory that cause the processor to determine, based on the received data, that the error correction unit crosses one or more data unit boundaries, and performing the asset change includes performing error correction processing on the sequence of error correction data units, and performing the asset change.

In some examples, the processor is configured to execute instructions stored in the memory that cause the processor to determine, based on the received data, that none of the sequence of error correction units cross any data unit boundaries, and performing the asset change comprises performing the asset change at a level of the sequence of error correction data units, such that error correction processing does not need to be performed on the sequence of error correction data units to perform the asset change.

In some examples, the second video data includes a second sequence of data units separated by second data unit boundaries, and a second sequence of error correction data units, wherein each error correction data unit is associated with one or more data units from the second sequence of data units. The processor is configured to execute instructions stored in the memory that cause the processor to determine, based on the received data, that none of the sequence of error correction units cross any data unit boundaries and that none of the second sequence of error correction units cross any second data unit boundaries, and perform the asset change comprises performing the asset change at a level of the sequence of error correction data units and second error correction data units, such that error correction processing does not need to be performed on the sequence of error correction data units or the second sequence of error correction data units to perform the asset change.

In some examples, the asset change request further includes second data indicative of an asset change type, wherein the asset change type comprises an insertion type indicating the second video data is to be inserted before the first video data.

Some embodiments relate to an apparatus for encoding asset change information for video data, the apparatus comprising a processor in communication with memory, the processor being configured to execute instructions stored in the memory that cause the processor to encode first video data, wherein the first video data includes a sequence of data units separated by data unit boundaries, and a sequence of error correction data units, wherein each error correction data unit is associated with one or more data units from the sequence of data units. The instructions cause the processor to generate error correction encoding data, based on the encoding step, to indicate whether an error correction data unit from the sequence of error correction data units associated with an asset change point of the first video data crosses one or more data unit boundaries of the first video data. The instructions cause the processor to transmit the encoded first video data and the generated error correction encoding data, such that a receiving device can perform, based on the generated error correction encoding data, an asset change operation for the first video data and second video data, wherein the second video data is different than the first video data.

There has thus been outlined, rather broadly, the features of the disclosed subject matter in order that the detailed description thereof that follows may be better understood, and in order that the present contribution to the art may be better appreciated. There are, of course, additional features of the disclosed subject matter that will be described hereinafter and which will form the subject matter of the claims appended hereto. It is to be understood that the phraseology and terminology employed herein are for the purpose of description and should not be regarded as limiting.

BRIEF DESCRIPTION OF DRAWINGS

In the drawings, each identical or nearly identical component that is illustrated in various figures is represented by a like reference character. For purposes of clarity, not every component may be labeled in every drawing. The drawings are not necessarily drawn to scale, with emphasis instead being placed on illustrating various aspects of the techniques and devices described herein.

DETAILED DESCRIPTION OF INVENTION

Various techniques can be used to support robust splicing capabilities, as discussed further herein. The inventors have appreciated that forward error correction can add overhead to splicing. If the error correction does not take into account the underlying data structure, error correction processing is required to process the data units (e.g., in order to perform the splicing). However, error correction processing can be avoided by taking into account the underlying data structure. Yet, the splicing device may still unnecessarily perform error correction processing when the splicing device cannot determine whether the forward error correction boundaries cross data unit boundaries. For example, even if forward error correction processing is not required to perform the splicing, if the splicing device cannot determine that is the case, the splicing device may still perform forward error correction processing to perform the splicing. Thus, without knowing whether the error correction units affect handling the data unit boundaries, a splicing device may need to perform error correction processing (e.g., even if is not necessary).

The techniques described herein can be used to provide robust splicing when forward error correction is used on the media data. The encoding device can signal to the splicing device whether the error correction for the source and/or destination content is data unit boundary aware, such that the forward error correction does not overlap data unit boundaries. For example, such signaling can allow a splicing device to perform a splicing operation without performing error correction processing on the source and/or destination content if the splicing device can determine from the received data that the source and/or destination content was error corrected in a manner that does not overlap the data unit boundaries. The techniques provide for indicating boundary awareness in different ways, including as part of signaling of the forward error correction information, and/or as part of an asset change request message.

The inventors have further appreciated that existing splicing techniques do not sufficiently support desired splicing capabilities, such as pre-roll or mid-roll advertisement insertion. For example, existing splicing capabilities are typically limited to replacing a target asset with a designated asset, or overlying an asset on a target asset. The techniques described herein provide for splicing techniques that allow for inserting a designated asset before a target asset. The techniques described herein further provide for splicing techniques that allow for robust blending modes that can be used for asset splicing, as discussed further herein. Such insertion and/or blending techniques can provide for robust splicing operations (e.g., that can be used for ad insertion) not supported by existing techniques.

In the following description, numerous specific details are set forth regarding the systems and methods of the disclosed subject matter and the environment in which such systems and methods may operate, etc., in order to provide a thorough understanding of the disclosed subject matter. In addition, it will be understood that the examples provided below are exemplary, and that it is contemplated that there are other systems and methods that are within the scope of the disclosed subject matter.

Figure 1:
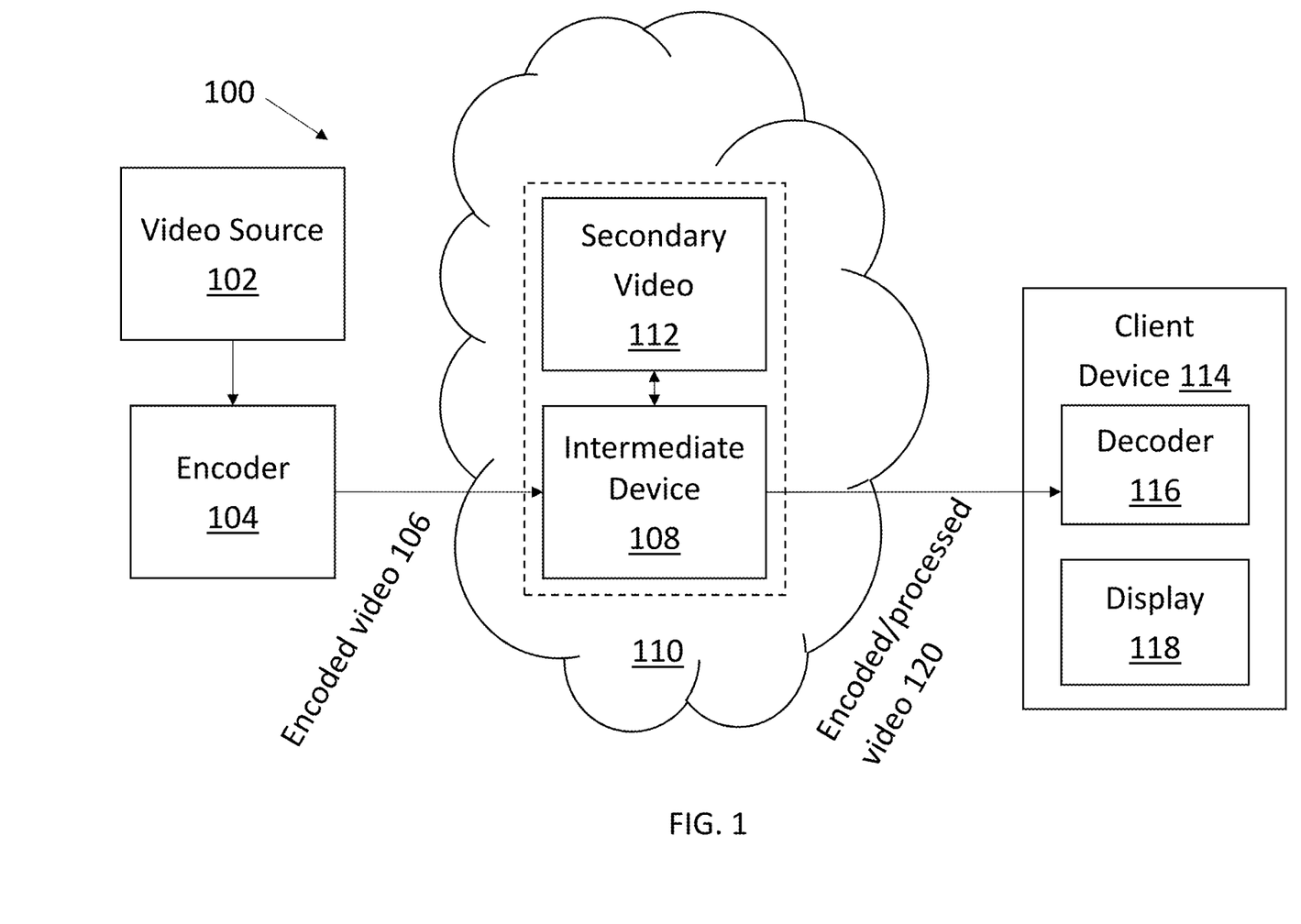
FIG. 1 shows an exemplary video transport and delivery configuration, according to some embodiments.

FIG. 1 shows an exemplary video transport and delivery configuration 100, according to some embodiments. Video source 102 can be any type of video source, such as a cell phone, a camera (e.g., cameras that include audio recording capabilities, and/or separate cameras and audio recording functionality), stored video data, computer-generated graphics, and/or the like. Encoder 104 encodes the video source into encoded video. The encoder 104 can reside on the same device that generated the video source 102, and/or may reside on a different device. The encoder 104 transports encoded video 106 to the intermediate device 108 via the network 110. The intermediate device 108 can be, for example, an MMT aware device and/or other device capable of performing video processing operations, such as splicing. The intermediate device 108 may be operated by, for example, a regional operator. The network can be, for example, a heterogeneous network, such as the Internet, a broadcast network, a mobile network (e.g., a cellular network), and/or the like. The intermediate device 108 is in communication with (and/or includes, e.g., in memory residing on the intermediate device 108) secondary video 112. As discussed further herein, the intermediate device 108 processes (e.g., splices) the encoded video 106 based on the secondary video 112 and/or additional data to generate encoded and processed video 120. The intermediate device 108 may operate as a receiving device to receive the encoded video 106 (and/or messages, not shown) from the encoder 104. In some embodiments, the intermediate device 108 performs FEC decoding and/or encoding, such as based on a message with the FEC_clean_type, as discussed further herein.

The client device 114 receives the encoded/processed video 120 from the intermediate device 108 via the network 110. The client device 114 includes a display 118 for displaying the decoded video. The client device 114 can be, for example, a computer, a cell phone, a set top box, a television, and/or any other client device configured to receive and play the encoded/processed video 120. The client device 114 includes a decoder 116 that is configured to decode the encoded video.

Figure 2:
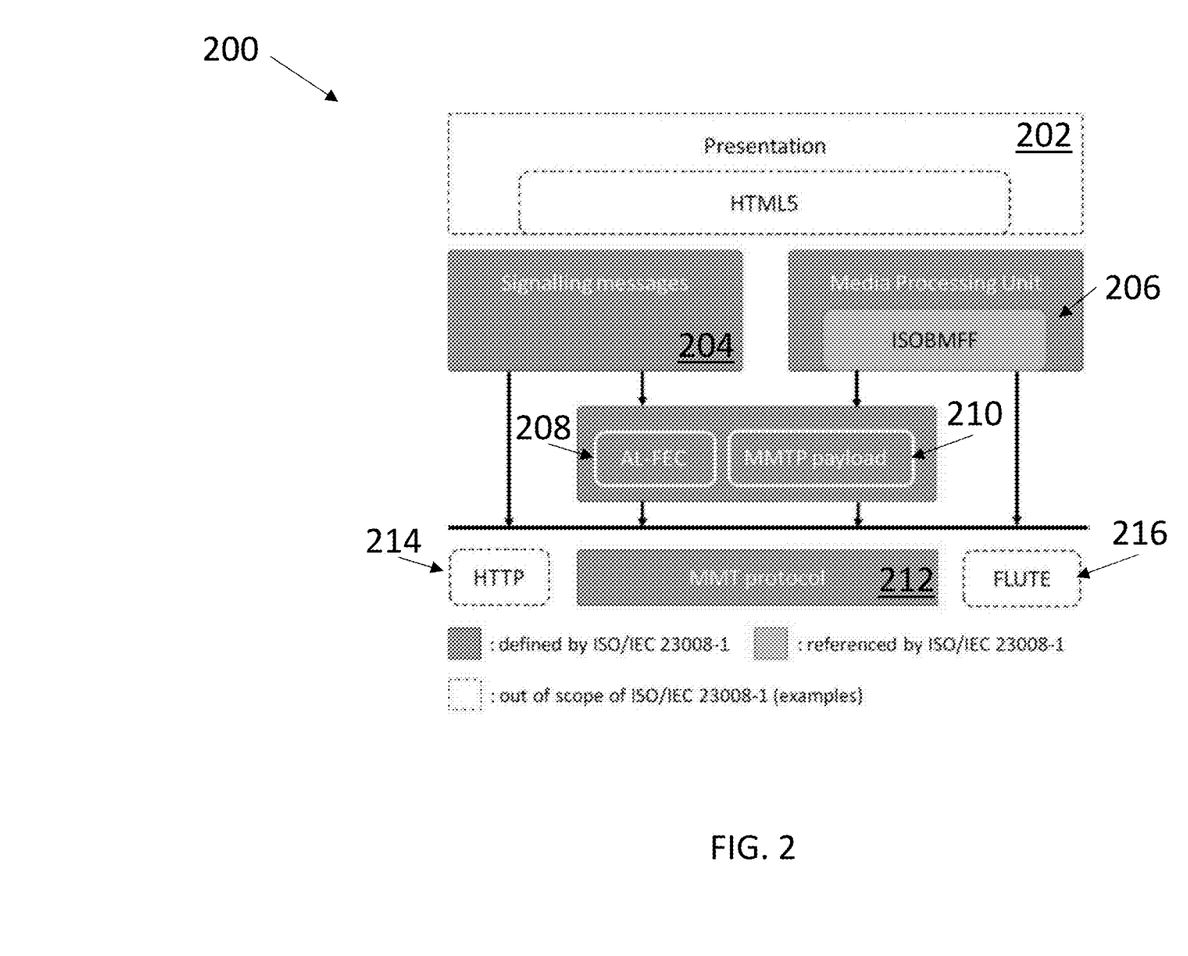
FIG. 2 shows portions of the Motion Picture Experts Group (MPEG) Media Transport (MMT) system stack, according to some examples.

Media components are processed into an MMT-specified format called the Media Processing Unit (MPU), which defines the content logical structure and the physical encapsulation format based on ISO base media file format (ISOBMFF). FIG. 2 shows portions of the MMT system stack 200, according to some examples. The system stack includes the presentation layer 202, signaling messages 204 and media processing unit 206, the AL-FEC 208 and the MMTP payload 210, and the MMT protocol (or MMTP) 212. The presentation layer 202 provides information on how to present an MMT Package in terms of both spatial and temporal relationships among MMT assets in a MMT package. Spatial and temporal relationships among multimedia components can be represented by HTML5 and Composition Information (CI). The MMT signaling messages 204 provide information for media consumption and delivery to the MMT client (e.g., the client device 114 in FIG. 1). The media processing unit 206 processes coded audio or video data into MPUs. MMTP payloads 210 are constructed by aggregating MPUs. In some embodiments, the size of the MMTP packet is configured to be appropriate for delivery.

AL-FEC 208 performs forward error correction, such as by using Reed-Solomon codes or low-density generator matrix (LDGM). Error correction can be useful when leveraging IP-based transmissions, such as delivery using UDP, where FEC can be used to recover from errors in transmissions. The MMT protocol 212 carries the AL-FEC MMTP packets on IP-based protocols, such as the HyperText Transfer Protocol (HTTP) 214, File Delivery over Unidirectional Transport (FLUTE) 216, and/or the like (e.g., UDP, TCP, etc., not shown). As shown, and as discussed further below, the Media Processing Unit 206 is separable from AL-FEC 208, and the MMT protocol 212 may be in a different module in the device.

The sending device (e.g., the encoder 104 in FIG. 1) can implement the MMT system stack shown in FIG. 2, and therefore the sending device can be responsible for preparing the content. In some embodiments, the sending device may be content aware, e.g., it may perform error correction in a manner such that the error correction for generating repair data does not cross data unit boundaries. The sending device can configure the content to indicate whether it is content aware, as discussed further herein. As noted above, the intermediate devices 108 can be an MMT aware device that can handle asset changes, e.g., including adding local ads. As also noted above, the intermediate devices 108 can be operated by a regional office. Asset changes are typically transparent to the client device 114, such as a client. In other words, typically the client device 114 may not be aware of any asset changes performed by intermediate device 108.

The techniques described herein can be used to signal error correction (e.g., AL-FEC) awareness of media data unit boundaries for timed data or non-timed data. As shown in the protocol stack 200 in FIG. 2, for a quality of service, AL-FEC 208 can be added on the MMTP packets for delivery over the IP networks. AL-FEC may use source symbol block sizes, which may not correspond to data unit boundaries. For example, AL-FEC implementations may be a separable module from packetization processing, and/or may be independent of media data format (e.g., as shown in FIG. 2). For example, AL-FEC implementations may be simply set by source symbol block size and repair symbol block size with a chosen FEC Code, and therefore the AL-FEC may be unaware of data unit boundaries of the associated media data format. Therefore changing MMT packages/assets on a given set of MMT packages, such as for splicing, may need to take into account the existence of the AL-FEC (e.g., since determining the AL-FEC symbol block sizes may not be sufficient to identify the media data unit boundaries).

If the AL-FEC is not aware of the underlying media data unit boundaries, it may result in a device needing to decode and re-code the AL-FEC (e.g., in order to determine the data unit boundaries) to perform a splicing operation. As mentioned above, it is desirable for MMT to support splicing features, such as for advertisement (Ad) insertion, including pre-roll and mid-roll, program editing and program switching. Splicing, for example, can refer to concatenating, at the MMT system level, two different MMT Assets in a manner such that the resulting MMT packages are conformant to the MMT standard. However, if AL-FEC is used, if the splicer (e.g., implemented by the intermediate device 108) does not know whether the AL-FEC is content aware, then the splicer likely will need to decode and re-code the FEC in order to splice the underlying media.

The techniques described herein can be used to signal whether the implemented AL-FEC is aware of media data unit boundaries, such that if the AL-FEC is aware of the media data unit boundaries, the AL-FEC source symbol block sizes will not cross the data unit boundaries (e.g., the boundaries of MPUs, Media Fragment Units (MFUs), or GFD data objects, which may serve as splicing points). If the AL-FEC implementation is data unit boundary aware, then changing or splicing assets by a splicer can be performed without needing to process the AL-FEC (e.g., without needing to decode and re-code the AL-FEC). Exposing splice opportunities, such as splicing points with their properties, on the MMTP packet level can be informative to splicing devices, including determining whether deep parsing is required to determine the media data format (e.g., when the AL-FEC encoding is not content aware).

In some embodiments, a signaling parameter can be used to signal whether the error correction (e.g., AL-FEC) is aware of the underlying data unit boundaries. For example, a parameter for signaling boundary awareness may be created as data_unit_boudary_aware_FEC. The parameter may, of course, use other naming conventions, and it is to be understood that "data_unit_boudary_aware_FEC" is used for illustrative purposes only, and is not intended to be limiting.

Figure 3A:
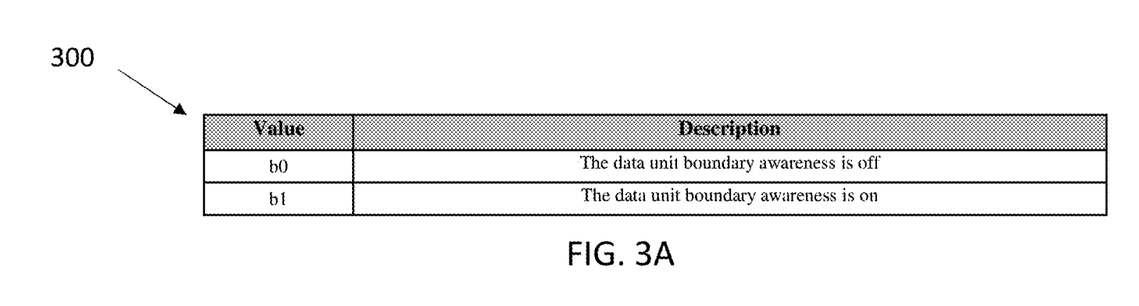
FIG. 3A shows an exemplary set of error correction data unit boundary aware parameters, according to some examples.

When using the MMT service, if using FEC, a message called the AL-FEC message is often used to configure the FEC module on the receiving side to match the FEC process used by the sending side. In some embodiments, the parameter (e.g., data_unit_boudary_aware_FEC) may be added as part of signaling of the AL-FEC message. For example, the data_unit_boudary_aware_FEC parameter may be represented using a single bit with values as illustrated in the table 300 in FIG. 3A. If the parameter has a value of "b0," then the parameter indicates that "the data unit boundary awareness is off" (e.g., the error correction is not aware of the underlying data unit boundaries). If the parameter has a value of "b1," then the parameter indicates that "the data unit boundary awareness is on" (e.g., the error correction is aware of the underlying data unit boundaries).

Figure 3B:
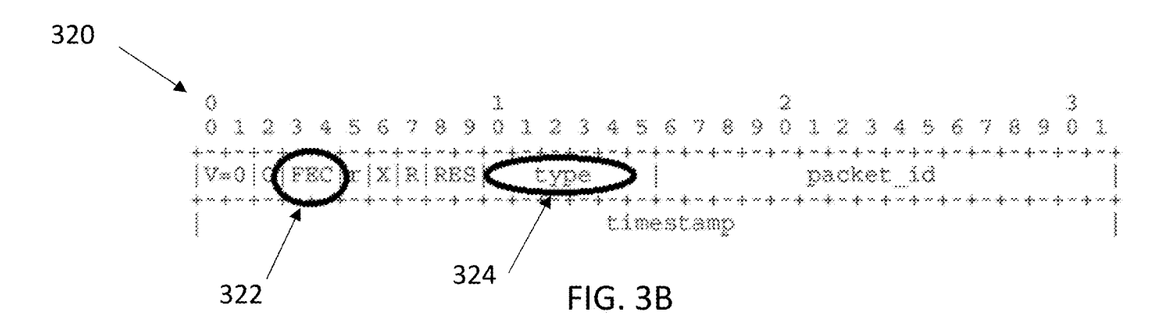
FIG. 3B shows portions of an MMTP packet header, according to some examples.
Figure 3C:
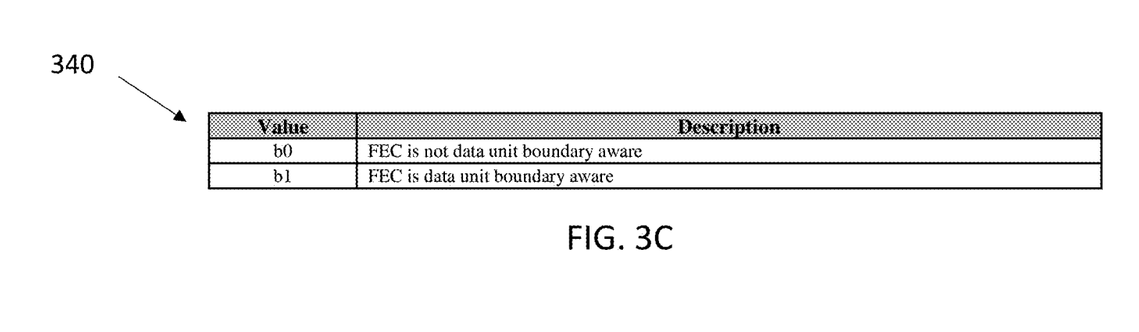
FIG. 3C an exemplary set of error correction data unit boundary aware parameters, according to some examples.

In some examples, the parameter (e.g., data_unit_boundary_aware_FEC) may be signaled using a bit field in the MMTP packet header. FIG. 3B shows portions of the MMTP packet header 320, including the "FEC" field 322 and the "type" field 324. In the MMTP packet header, the "type" field 324 signals the types of packets, including for source packets and repair packets. In the standard, only one bit of the FEC field 322 is used to signal the FEC Payload ID Mode, which also indicates the original signaling of FEC=0 or FEC=1. Thus the existing two bits of the current FEC field 322 in the packet header 320 may be split into two separate bits, e.g., one (e.g., "M") bit used to signal boundary awareness, and a second (e.g., "B") bit used to signal the FEC Payload ID mode (where "M" and "B" are used for exemplary, illustrative purposes only). The "M" bit may have values as shown in table 340 in FIG. 3C. If the bit has a value of "b0," then the parameter indicates that "FEC is not data unit boundary aware" (e.g., the error correction is not aware of the underlying data unit boundaries). If the bit has a value of "b1," then the parameter indicates that "FEC is data unit boundary aware" (e.g., the error correction is aware of the underlying data unit boundaries).

Splicing can be supported by adding an Asset Change Request (ACR) message, as is described in ISO/IEC 23008-1:201x DAM2 Enhancement for Mobile Environments," W16648, January, 2017, Geneva, Switzerland, which is hereby incorporated by reference herein in its entirety. The ACR message can be included to support asset changes or splicing processing. The ACR message can be used, for example, to signal and set target assets with various parameters. As noted above, in the MMT context, asset changes or splicing can be performed to concatenate, on the MMT system level, two different MMT Assets and the resulting MMT packages are conformant to the MMT standard. When an MMT-aware Network Entity ("MANE") or splicing device receives the ACR message as a change event, it can be configured to perform the processing accordingly. The device can use a local Asset (e.g., a local ad using content locally), or use a third party ad (e.g., by retrieving the content remotely from a URL).

The techniques described herein can be used to signal AL-FEC awareness of media data unit boundaries for timed data or non-timed data in the ACR message (e.g., for the media data splicing). In some embodiments, a field can be included in the ACR message to signal data related to AL-FEC awareness. For example, a single bit (e.g., a flag) can be added to signal such characteristics of the target asset in the ACR message.

Figure 4A:
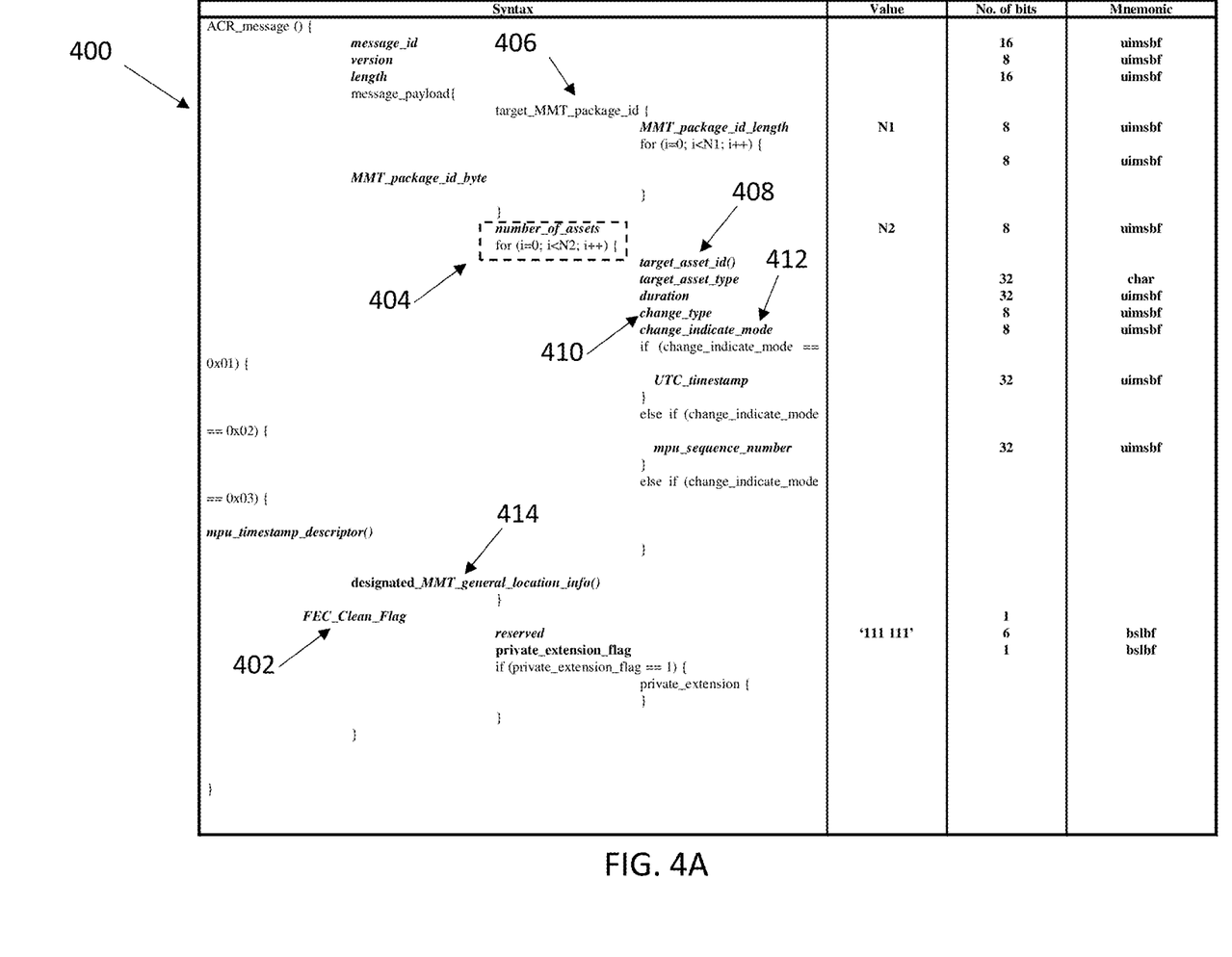
FIG. 4A shows a first example of an exemplary asset change request (ACR) message syntax with a field to convey data related to error correction awareness of data unit boundaries, according to some embodiments.

FIG. 4A shows an exemplary ACR message syntax 400 with a field to convey data related to error correction awareness of data unit boundaries, according to some embodiments. The ACR message syntax 400 includes the field 'FEC_Clean_Flag' 402. It is to be understood that the label FEC_Clean_Flag is used for exemplary purposes and for purposes of illustration only, and is not intended to be limiting. Other field names or labels can be used without departing from the spirit of the invention.

In some embodiments, the FEC_Clean_Flag is one bit. For example, when the FEC_Clean_Flag is set to 1 (e.g., by the encoder 104 shown in FIG. 1), the FEC_Clean_Flag can indicate that asset changing points of the target assets (e.g., an asset changing-in point(s) or an asset changing-out point(s)), are clean of the AL-FEC encoding which means no source block sizes cross the data unit boundaries. For example, if set to 1, a receiving device (e.g., the intermediate device 108, such as a splicer) can use the flag to determine that AL-FEC processing is not needed when performing an asset change(s) with this message. When set to 0, otherwise, the receiving device can determine that AL-FEC processing is needed when performing an asset change(s) with this message.

Figure 4B:
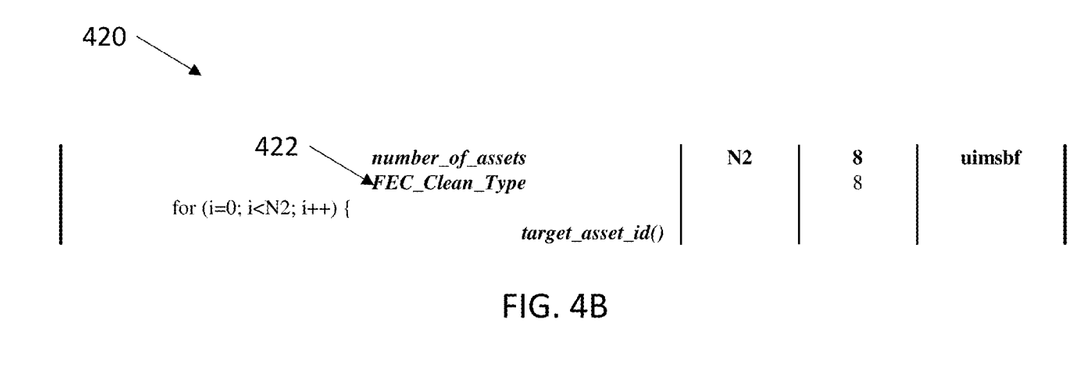
FIG. 4B shows a second example of an exemplary asset change request (ACR) message syntax with a field to convey data related to error correction awareness of data unit boundaries, according to some examples.

It should be appreciated that the placement of data in the ACR message according to the techniques described herein (e.g., the placement of the FEC_Clean_Flag 402 in the ACR message syntax 400) is for exemplary purposes, and that the data can be placed in other locations in the ACR message. Additionally, any number of bits may be allocated to the data, since the techniques described herein are not limited to using just one bit as described in conjunction with FIG. 4A. FIG. 4B shows an exemplary portion of the ACR message syntax 420 with a field to convey data related to error correction awareness of data unit boundaries in a different location than FIG. 4A, according to some embodiments. The portion of the ACR message syntax 420 is the portion in the ACR message syntax 400 surrounded with the dotted box 404. As shown in FIG. 4B, the data (e.g., flag) FEC_Clean_Type 422 may be designed to appear earlier in the ACR message. As shown for FEC_Clean_Type 422, the data can be assigned, in this example, eight bits.

Figure 4C:
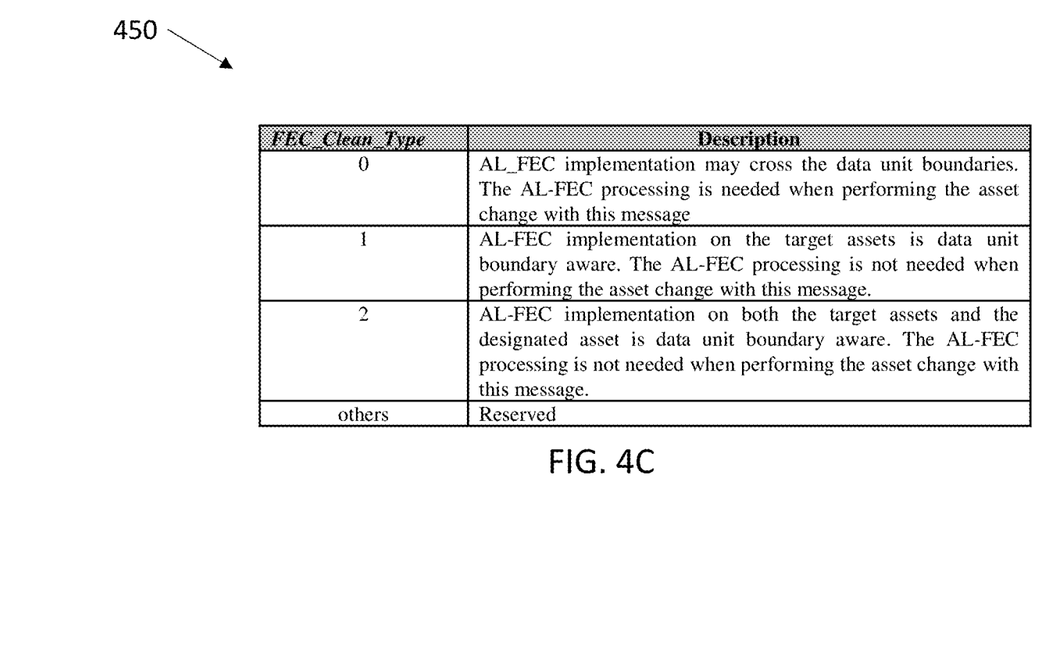
FIG. 4C shows a table with exemplary signaling information for data related to error correction awareness of data unit boundaries, according to some examples.

FIG. 4C illustrates an exemplary table 450 with signaling information for data related to error correction awareness of data unit boundaries, according to some embodiments. For example, FEC_Clean_Type 402 or 422 (and/or other examples with different numbers of bits) may be designed to signal information as shown in table 450. For example, FEC_Clean_Type 420 may be used to signal the types of just "0" or "1," since FEC_Clean_Type is only allocated one bit. As another example, FEC_Clean_Type 422 may be used to signal all of the types shown in table 420. If the ACR message field is set to "0," then the field can signal that the AL FEC implementation may cross the data unit boundaries. This can inform a receiving device that AL-FEC processing is needed when performing the asset change with this message. If the ACR message field is set to "1," then the field can signal that the AL-FEC implementation on the target assets is data unit boundary aware. This can inform a receiving device that AL-FEC processing is not needed when performing the asset change with this message. If the ACR message field is set to "2," then the field can signal that the AL-FEC implementation on both the target assets and the designated asset is data unit boundary aware. This can inform a receiving device that AL-FEC processing is not needed when performing the asset change with this message. Additional potential "other" bit values can be "reserved" for future implementations. It should be appreciated that the AL-FEC awareness signaling (e.g., the FEC_Clean_Flag) may be assigned in other MMT messages, and/or a new MMT messages as the standard is further developed, as appropriate.

As noted above, an MMT application may send an ACR message to signal the asset change event information, which can include various parameters. Referring further to FIG. 4A, the ACR message may include a number of different parameters. For example, the ACR message parameters can include, for example, the target MMT package identifier target_MMT_package_id 406 (e.g., which indicates the identifier of the target package to be changed), the target asset identifier target_asset_id 408 (e.g., which indicates the identifier of the Asset to be changed), the change type change_type 410 (e.g., which indicates the type of media change on the target Asset which is indicated by target_asset_id), the change indicate mode change_indicate_mode 412 (e.g., which can define how to indicate the time at which the media change occurs), and/or the like.

Figure 5:
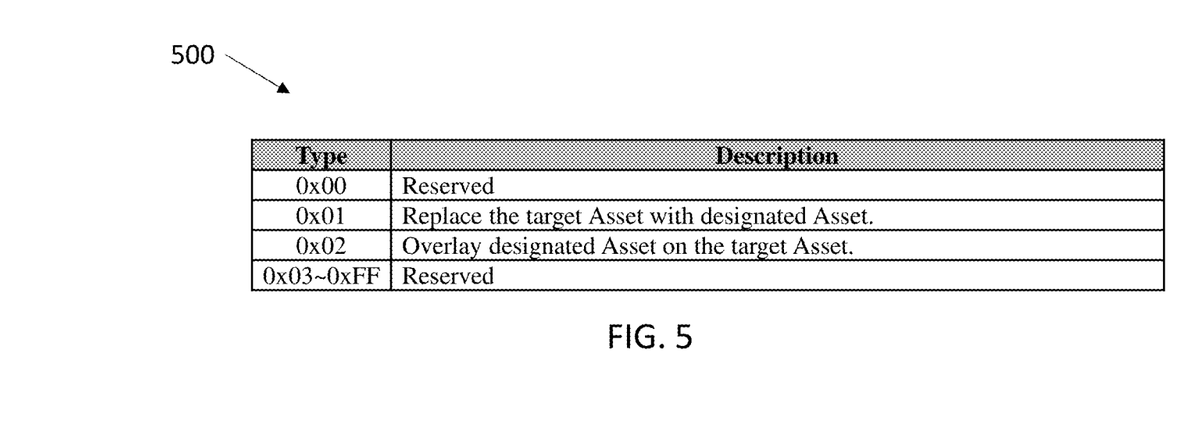
FIG. 5 shows a table showing an illustrative syntax for a change type, according to some examples.

Referring to the change type (e.g., change_type), the target Asset can be changed with the designated Asset, in the manner that the change type field describes. Referring back to FIG. 4A, the designated Asset can be located in the designated MMT general location information designated_MMT_general_location_info 414. FIG. 5 shows a table 500 showing an illustrative syntax for a change type, according to some examples (e.g., the syntax of the change_type field 410). For example, the values of 0x00 and 0x03 through 0xFF can be reserved, such as for future use. A value of 0x01 can be used to indicate that the receiving device should replace the target Asset with designated Asset. A value of 0x02 can be used to indicate that the receiving device should overlay the designated Asset on the target Asset. In the case of a value of 0x02, the overlay location of the designated Asset can be provided by a PI document, such as the MPEG Composition Information (CI) document, a layout configuration table as defined in the standard, and/or the like.

Figure 6:
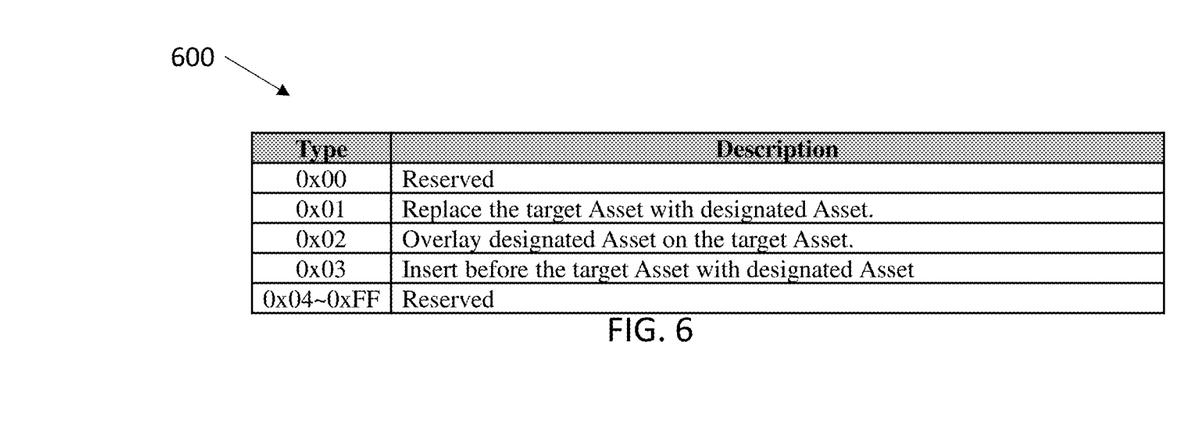
FIG. 6 shows a table of exemplary values of change types, in accordance with some embodiments.

The techniques describe herein extend the functionality of the change type. FIG. 6 shows a table 600 of values of change_type, in accordance with some embodiments. FIG. 6 shows a new value for the asset change type of 0x03 for an insertion not in the table 500 shown in FIG. 5, which is to perform an insertion before the target Asset with the designated Asset. The insertion type can be used, for example, to support use cases of pre-roll or mid-roll of Ad insertion (e.g., since the replacement type of 0x01 may not support pre-roll and/or mid-roll Ad insertion cases).

According to the techniques described herein, for the overlay case of a change type value of 0x02, a blending mode can be incorporated into the overlay case. According to some embodiments, The proposed changes of the syntax and semantics of the ACR message can be to include a blending mode if the change type is an overlay. For example, the ACR message syntax can include adding an 8 bit alpha blending mode (alpha_blending_mode):

```
change_type
if (change_type = 0x02){
alpha_blending_mode;        // 8 bits
}
```

Figure 7:
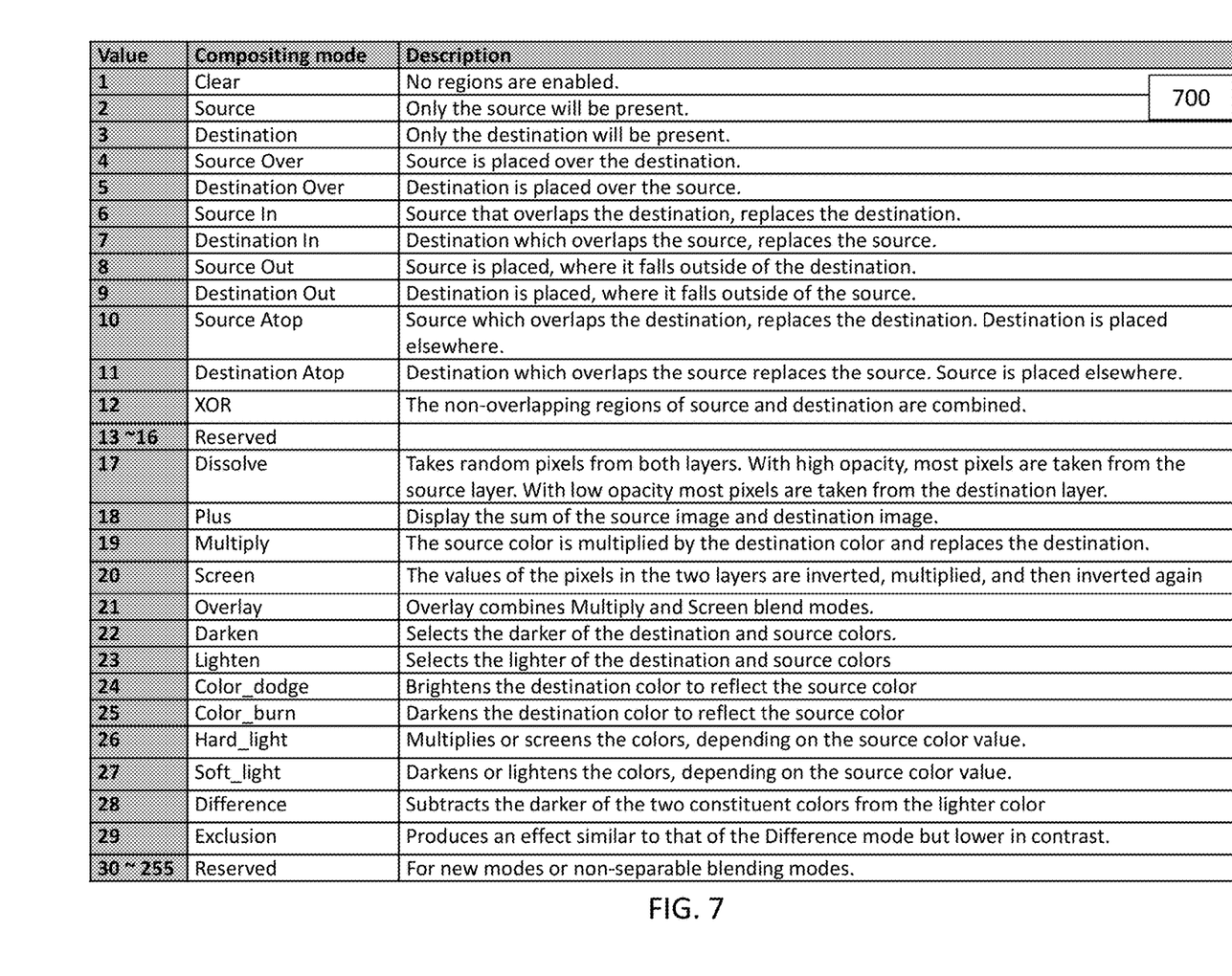
FIG. 7 is a table of exemplary alpha blending modes, according to some embodiments.

The alpha blending mode can specify the alpha blending mode using a defined set of modes. FIG. 7 is a table of exemplary alpha blending modes, according to some embodiments. A value of "1" includes a compositing mode of "Clear" which means that no regions are enabled. A value of "2" includes a compositing mode of "Source" which means that only the source will be present. A value of "3" includes a compositing mode of "Destination" which means that only the destination will be present. A value of "4" includes a compositing mode of "Source Over" which means that the source is placed over the destination. A value of "5" includes a compositing mode of "Destination Over" which means that the destination is placed over the source. A value of "6" includes a compositing mode of "Source In" which means that the source that overlaps the destination, replaces the destination. A value of "7" includes a compositing mode of "Destination In" which means that the destination which overlaps the source, replaces the source. A value of "8" includes a compositing mode of "Source Out" which means that the source is placed, where it falls outside of the destination. A value of "9" includes a compositing mode of "Destination Out" which means that the destination is placed, where it falls outside of the source. A value of "10" includes a compositing mode of "Source Atop" which means that the source which overlaps the destination, replaces the destination, and the destination is placed elsewhere. A value of "11" includes a compositing mode of "Destination Atop" which means that the destination which overlaps the source replaces the source, and the source is placed elsewhere. A value of "12" includes a compositing mode of "XOR" which means that the non-overlapping regions of source and destination are combined. A value of "17" includes a compositing mode of "Dissolve" which means that the mode takes random pixels from both layers (e.g., with high opacity, most pixels are taken from the source layer, and/or with low opacity most pixels are taken from the destination layer). A value of "18" includes a compositing mode of "Plus" which means that the mode will display the sum of the source image and destination image. A value of "19" includes a compositing mode of "Multiply" which means that the source color is multiplied by the destination color and replaces the destination. A value of "20" includes a compositing mode of "Screen" which means that the values of the pixels in the two layers are inverted, multiplied, and then inverted again. A value of "21" includes a compositing mode of "Overlay" which means that the overlay combines Multiply and Screen blend modes. A value of "22" includes a compositing mode of "Darken" which means that the mode selects the darker of the destination and source colors. A value of "23" includes a compositing mode of "Lighten" which means that selects the lighter of the destination and source colors. A value of "24" includes a compositing mode of "Color_dodge" which means that the mode brightens the destination color to reflect the source color. A value of "25" includes a compositing mode of "Color_burn" which means that the mode darkens the destination color to reflect the source color. A value of "26" includes a compositing mode of "Hard_light" which means that the mode multiplies or screens the colors, depending on the source color value. A value of "27" includes a compositing mode of "Soft_light" which means that the mode darkens or lightens the colors, depending on the source color value. A value of "28" includes a compositing mode of "Difference" which means that the mode subtracts the darker of the two constituent colors from the lighter color. A value of "29" includes a compositing mode of "Exclusion" which means that the mode produces an effect similar to that of the Difference mode but lower in contrast. A value of 13-16 and 30-255 can be reserved (e.g., for new modes or non-separable blending modes).

In some embodiments, the alpha blending modes (e.g., and the associated algorithms with default parameters) can be defined in a separate document, e.g. ISO/IEC 23001-8, ISO/IEC 23091-1 or a W3C recommendation, such as "W3C: Composing and Blending 1.0," W3C Candidate Recommendation, January 2015, which is hereby incorporated by reference herein in its entirety. The layout configuration table can provide a relative front and back layer indicator for the blending. For example, in FIG. 7 and the description above, the term 'Source' and the term 'Destination' can be used to refer to the front/top layer and the back/bottom layer or the backdrop, respectively.

Techniques operating according to the principles described herein may be implemented in any suitable manner. The processing and decision blocks of the flow charts above represent steps and acts that may be included in algorithms that carry out these various processes. Algorithms derived from these processes may be implemented as software integrated with and directing the operation of one or more single- or multi-purpose processors, may be implemented as functionally-equivalent circuits such as a Digital Signal Processing (DSP) circuit or an Application-Specific Integrated Circuit (ASIC), or may be implemented in any other suitable manner. It should be appreciated that the flow charts included herein do not depict the syntax or operation of any particular circuit or of any particular programming language or type of programming language. Rather, the flow charts illustrate the functional information one skilled in the art may use to fabricate circuits or to implement computer software algorithms to perform the processing of a particular apparatus carrying out the types of techniques described herein. It should also be appreciated that, unless otherwise indicated herein, the particular sequence of steps and/or acts described in each flow chart is merely illustrative of the algorithms that may be implemented and can be varied in implementations and embodiments of the principles described herein.

Accordingly, in some embodiments, the techniques described herein may be embodied in computer-executable instructions implemented as software, including as application software, system software, firmware, middleware, embedded code, or any other suitable type of computer code. Such computer-executable instructions may be written using any of a number of suitable programming languages and/or programming or scripting tools, and also may be compiled as executable machine language code or intermediate code that is executed on a framework or virtual machine.

When techniques described herein are embodied as computer-executable instructions, these computer-executable instructions may be implemented in any suitable manner, including as a number of functional facilities, each providing one or more operations to complete execution of algorithms operating according to these techniques. A "functional facility," however instantiated, is a structural component of a computer system that, when integrated with and executed by one or more computers, causes the one or more computers to perform a specific operational role. A functional facility may be a portion of or an entire software element. For example, a functional facility may be implemented as a function of a process, or as a discrete process, or as any other suitable unit of processing. If techniques described herein are implemented as multiple functional facilities, each functional facility may be implemented in its own way; all need not be implemented the same way. Additionally, these functional facilities may be executed in parallel and/or serially, as appropriate, and may pass information between one another using a shared memory on the computer(s) on which they are executing, using a message passing protocol, or in any other suitable way.

Generally, functional facilities include routines, programs, objects, components, data structures, etc. that perform particular tasks or implement particular abstract data types. Typically, the functionality of the functional facilities may be combined or distributed as desired in the systems in which they operate. In some implementations, one or more functional facilities carrying out techniques herein may together form a complete software package. These functional facilities may, in alternative embodiments, be adapted to interact with other, unrelated functional facilities and/or processes, to implement a software program application.

Some exemplary functional facilities have been described herein for carrying out one or more tasks. It should be appreciated, though, that the functional facilities and division of tasks described is merely illustrative of the type of functional facilities that may implement the exemplary techniques described herein, and that embodiments are not limited to being implemented in any specific number, division, or type of functional facilities. In some implementations, all functionality may be implemented in a single functional facility. It should also be appreciated that, in some implementations, some of the functional facilities described herein may be implemented together with or separately from others (i.e., as a single unit or separate units), or some of these functional facilities may not be implemented.

Computer-executable instructions implementing the techniques described herein (when implemented as one or more functional facilities or in any other manner) may, in some embodiments, be encoded on one or more computer-readable media to provide functionality to the media. Computer-readable media include magnetic media such as a hard disk drive, optical media such as a Compact Disk (CD) or a Digital Versatile Disk (DVD), a persistent or non-persistent solid-state memory (e.g., Flash memory, Magnetic RAM, etc.), or any other suitable storage media. Such a computer-readable medium may be implemented in any suitable manner. As used herein, "computer-readable media" (also called "computer-readable storage media") refers to tangible storage media. Tangible storage media are non-transitory and have at least one physical, structural component. In a "computer-readable medium," as used herein, at least one physical, structural component has at least one physical property that may be altered in some way during a process of creating the medium with embedded information, a process of recording information thereon, or any other process of encoding the medium with information. For example, a magnetization state of a portion of a physical structure of a computer-readable medium may be altered during a recording process.

Further, some techniques described above comprise acts of storing information (e.g., data and/or instructions) in certain ways for use by these techniques. In some implementations of these techniques—such as implementations where the techniques are implemented as computer-executable instructions—the information may be encoded on a computer-readable storage media. Where specific structures are described herein as advantageous formats in which to store this information, these structures may be used to impart a physical organization of the information when encoded on the storage medium. These advantageous structures may then provide functionality to the storage medium by affecting operations of one or more processors interacting with the information; for example, by increasing the efficiency of computer operations performed by the processor(s).

In some, but not all, implementations in which the techniques may be embodied as computer-executable instructions, these instructions may be executed on one or more suitable computing device(s) operating in any suitable computer system, or one or more computing devices (or one or more processors of one or more computing devices) may be programmed to execute the computer-executable instructions. A computing device or processor may be programmed to execute instructions when the instructions are stored in a manner accessible to the computing device or processor, such as in a data store (e.g., an on-chip cache or instruction register, a computer-readable storage medium accessible via a bus, a computer-readable storage medium accessible via one or more networks and accessible by the device/processor, etc.). Functional facilities comprising these computer-executable instructions may be integrated with and direct the operation of a single multi-purpose programmable digital computing device, a coordinated system of two or more multi-purpose computing device sharing processing power and jointly carrying out the techniques described herein, a single computing device or coordinated system of computing device (co-located or geographically distributed) dedicated to executing the techniques described herein, one or more Field-Programmable Gate Arrays (FPGAs) for carrying out the techniques described herein, or any other suitable system.

A computing device may comprise at least one processor, a network adapter, and computer-readable storage media. A computing device may be, for example, a desktop or laptop personal computer, a personal digital assistant (PDA), a smart mobile phone, a server, or any other suitable computing device. A network adapter may be any suitable hardware and/or software to enable the computing device to communicate wired and/or wirelessly with any other suitable computing device over any suitable computing network. The computing network may include wireless access points, switches, routers, gateways, and/or other networking equipment as well as any suitable wired and/or wireless communication medium or media for exchanging data between two or more computers, including the Internet. Computer-readable media may be adapted to store data to be processed and/or instructions to be executed by processor. The processor enables processing of data and execution of instructions. The data and instructions may be stored on the computer-readable storage media.

A computing device may additionally have one or more components and peripherals, including input and output devices. These devices can be used, among other things, to present a user interface. Examples of output devices that can be used to provide a user interface include printers or display screens for visual presentation of output and speakers or other sound generating devices for audible presentation of output. Examples of input devices that can be used for a user interface include keyboards, and pointing devices, such as mice, touch pads, and digitizing tablets. As another example, a computing device may receive input information through speech recognition or in other audible format.

Embodiments have been described where the techniques are implemented in circuitry and/or computer-executable instructions. It should be appreciated that some embodiments may be in the form of a method, of which at least one example has been provided. The acts performed as part of the method may be ordered in any suitable way. Accordingly, embodiments may be constructed in which acts are performed in an order different than illustrated, which may include performing some acts simultaneously, even though shown as sequential acts in illustrative embodiments.

Various aspects of the embodiments described above may be used alone, in combination, or in a variety of arrangements not specifically discussed in the embodiments described in the foregoing and is therefore not limited in its application to the details and arrangement of components set forth in the foregoing description or illustrated in the drawings. For example, aspects described in one embodiment may be combined in any manner with aspects described in other embodiments.

Use of ordinal terms such as "first," "second," "third," etc., in the claims to modify a claim element does not by itself connote any priority, precedence, or order of one claim element over another or the temporal order in which acts of a method are performed, but are used merely as labels to distinguish one claim element having a certain name from another element having a same name (but for use of the ordinal term) to distinguish the claim elements.

Also, the phraseology and terminology used herein is for the purpose of description and should not be regarded as limiting. The use of "including," "comprising," "having," "containing," "involving," and variations thereof herein, is meant to encompass the items listed thereafter and equivalents thereof as well as additional items.

The word "exemplary" is used herein to mean serving as an example, instance, or illustration. Any embodiment, implementation, process, feature, etc. described herein as exemplary should therefore be understood to be an illustrative example and should not be understood to be a preferred or advantageous example unless otherwise indicated.

Having thus described several aspects of at least one embodiment, it is to be appreciated that various alterations, modifications, and improvements will readily occur to those skilled in the art. Such alterations, modifications, and improvements are intended to be part of this disclosure, and are intended to be within the spirit and scope of the principles described herein. Accordingly, the foregoing description and drawings are by way of example only.

What is claimed is:

1. A method for performing an asset change for video data, the method comprising:
   receiving first video data, wherein the first video data comprises:
      a sequence of data units separated by data unit boundaries; and
      a sequence of error correction data units, wherein each error correction data unit is associated with one or more data units from the sequence of data units;
   determining, based on the received first video data, whether an error correction data unit from the sequence of error correction data units associated with an asset change point of the first video data crosses one or more data unit boundaries of the first video data, such that the one or more data unit boundaries are included within the error correction data unit; and
   performing an asset change operation for the first video data and second video data, wherein the second video data is different from the first video data, comprising, based on the determination, selectively performing error correction processing on the set of error correction data units to perform the asset change operation.

2. The method of claim 1, wherein determining whether the error correction unit crosses one or more data unit boundaries comprises:
   receiving an asset change request message that comprises data indicative of whether the error correction unit crosses one or more data unit boundaries; and
   determining whether the error correction unit crosses one or more data unit boundaries based on the received data.

3. The method of claim 2, further comprising:
   determining, based on the received data, that the error correction unit crosses one or more data unit boundaries; and
   performing the asset change comprises:
      performing error correction processing on the sequence of error correction data units; and
      performing the asset change.

4. The method of claim 2, further comprising:
   determining, based on the received data, that:
      none of the sequence of error correction units cross any data unit boundaries; and performing the asset change comprises performing the asset change at a level of the sequence of error correction data units, such that error correction processing does not need to be performed on the sequence of error correction data units to perform the asset change.

5. The method of claim 2, wherein:
the second video data comprises:
a second sequence of data units separated by second data unit boundaries; and
a second sequence of error correction data units, wherein each error correction data unit is associated with one or more data units from the second sequence of data units; the method further comprising:
determining, based on the received data, that:
none of the sequence of error correction units cross any data unit boundaries; and
none of the second sequence of error correction units cross any second data unit boundaries;
performing the asset change comprises performing the asset change at a level of the sequence of error correction data units and second error correction data units, such that error correction processing does not need to be performed on the sequence of error correction data units or the second sequence of error correction data units to perform the asset change.

6. The method of claim 2, wherein the asset change request further comprises second data indicative of an asset change type, wherein the asset change type comprises an insertion type indicating the second video data is to be inserted before the first video data.

7. A method for encoding asset change information for video data, the method comprising:
encoding first video data, wherein the first video data comprises:
a sequence of data units separated by data unit boundaries; and
a sequence of error correction data units, wherein each error correction data unit is associated with one or more data units from the sequence of data units;
generating error correction encoding data, based on the encoding step, to indicate whether an error correction data unit from the sequence of error correction data units associated with an asset change point of the first video data crosses one or more data unit boundaries of the first video data such that the one or more data unit boundaries are included within the error correction data unit; and
transmitting the encoded first video data and the generated error correction encoding data, such that a receiving device can perform an asset change operation for the first video data and second video data, wherein the second video data is different than the first video data, comprising, based on the generated error correction encoding data, selectively performing error correction processing on the set of error correction data units to perform the asset change operation.

8. The method of claim 7:
wherein generating the error correction encoding data comprises generating an asset change request message that comprises data indicative of whether the error correction unit crosses one or more data unit boundaries; and
wherein transmitting the encoded first video data and the generated data comprises transmitting the encoded first video data and the asset change request message.

9. The method of claim 8, wherein generating the asset change request message comprises generating data indicative of the error correction unit crossing one or more data unit boundaries, such that the receiving device will perform error correction processing on the sequence of error correction data units to perform the asset change operation.

10. The method of claim 8, wherein generating the asset change request message comprises generating data indicative of none of the sequence of error correction units cross any data unit boundaries, such that the receiving device will perform the asset change operation at a level of the sequence of error correction data units, such that error correction processing does not need to be performed on the sequence of error correction data units to perform the asset change operation.

11. The method of claim 8, wherein generating the asset change request message comprises generating data indicative of:
none of the sequence of error correction units cross any data unit boundaries; and
none of a second sequence of error correction units of second video data cross any second data unit boundaries of the second video data, wherein each error correction data unit is associated with one or more data units from a second sequence of data units separated by the second data unit boundaries;
such that the receiving device will perform the asset change operation at a level of the sequence of error correction data units and second error correction data units, such that the receiving device does not perform error correction processing on the sequence of error correction data units or the second sequence of error correction data units to perform the asset change operation.

12. The method of claim 8, wherein generating the asset change request message comprises generating second data indicative of an asset change type, wherein the asset change type comprises an insertion type indicating the second video data is to be inserted before the first video data.

13. An apparatus for performing an asset change for video data, the apparatus comprising a processor in communication with memory, the processor being configured to execute instructions stored in the memory that cause the processor to:
receive first video data, wherein the first video data comprises:
a sequence of data units separated by data unit boundaries; and
a sequence of error correction data units, wherein each error correction data unit is associated with one or more data units from the sequence of data units;
determine, based on the received first video data, whether an error correction data unit from the sequence of error correction data units associated with an asset change point of the first video data crosses one or more data unit boundaries of the first video data, such that the one or more data unit boundaries are included within the error correction data unit; and
perform an asset change operation for the first video data and second video data, wherein the second video data is different than the first video data, comprising, based on the determination, selectively performing error correction processing on the set of error correction data units to perform the asset change operation.

14. The apparatus of claim 13, wherein determining whether the error correction unit crosses one or more data unit boundaries comprises:

receiving an asset change request message that comprises data indicative of whether the error correction unit crosses one or more data unit boundaries; and determining whether the error correction unit crosses one or more data unit boundaries based on the received data.

15. The apparatus of claim 14, wherein:

the processor is configured to execute instructions stored in the memory that cause the processor to determine, based on the received data, that the error correction unit crosses one or more data unit boundaries; and performing the asset change comprises:
  performing error correction processing on the sequence of error correction data units; and
  performing the asset change.

16. The apparatus of claim 14, wherein:

the processor is configured to execute instructions stored in the memory that cause the processor to determine, based on the received data, that none of the sequence of error correction units cross any data unit boundaries; and performing the asset change comprises performing the asset change at a level of the sequence of error correction data units, such that error correction processing does not need to be performed on the sequence of error correction data units to perform the asset change.

17. The apparatus of claim 14, wherein:

the second video data comprises:
  a second sequence of data units separated by second data unit boundaries; and
  a second sequence of error correction data units, wherein each error correction data unit is associated with one or more data units from the second sequence of data units; and the processor is configured to execute instructions stored in the memory that cause the processor to:
  determine, based on the received data, that:
    none of the sequence of error correction units cross any data unit boundaries; and
    none of the second sequence of error correction units cross any second data unit boundaries; and perform the asset change comprises performing the asset change at a level of the sequence of error correction data units and second error correction data units, such that error correction processing does not need to be performed on the sequence of error correction data units or the second sequence of error correction data units to perform the asset change.

18. The apparatus of claim 14, wherein the asset change request further comprises second data indicative of an asset change type, wherein the asset change type comprises an insertion type indicating the second video data is to be inserted before the first video data.

19. An apparatus for encoding asset change information for video data, the apparatus comprising a processor in communication with memory, the processor being configured to execute instructions stored in the memory that cause the processor to:

encode first video data, wherein the first video data comprises:
  a sequence of data units separated by data unit boundaries; and
  a sequence of error correction data units, wherein each error correction data unit is associated with one or more data units from the sequence of data units;

generate error correction encoding data, based on the encoding step, to indicate whether an error correction data unit from the sequence of error correction data units associated with an asset change point of the first video data crosses one or more data unit boundaries of the first video data such that the one or more data unit boundaries are included within the error correction data unit; and transmit the encoded first video data and the generated error correction encoding data, such that a receiving device can perform an asset change operation for the first video data and second video data, wherein the second video data is different than the first video data, comprising, based on the generated error correction encoding data, selectively performing error correction processing on the set of error correction data units to perform the asset change operation.

* * * * *